US012775049B2

(12) United States Patent
Wu et al.

(10) Patent No.: US 12,775,049 B2
(45) Date of Patent: Oct. 27, 2026

(54) UNIVERSAL GAUGE MASTER SOLUTION AT MULTI-BATTERY SYSTEM

(71) Applicant: MEDIATEK INC., Hsin-Chu (TW)

(72) Inventors: Jui-Chi Wu, Hsinchu City (TW); Jia-You Chuang, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 716 days.

(21) Appl. No.: 18/113,626

(22) Filed: Feb. 24, 2023

(65) Prior Publication Data

US 2023/0280402 A1 Sep. 7, 2023

Related U.S. Application Data

(60) Provisional application No. 63/317,094, filed on Mar. 7, 2022.

(51) Int. Cl.

| | |
|---|---|
| ***G01R 31/36*** | (2020.01) |
| ***G01R 31/367*** | (2019.01) |
| ***G01R 31/371*** | (2019.01) |
| ***H01M 10/42*** | (2006.01) |
| *G01R 31/382* | (2019.01) |
| *H04Q 9/00* | (2006.01) |

(52) U.S. Cl.

CPC ....... *G01R 31/3648* (2013.01); *G01R 31/367* (2019.01); *G01R 31/371* (2019.01); *H01M 10/425* (2013.01); *G01R 31/382* (2019.01); *H01M 2010/4278* (2013.01); *H04Q 9/00* (2013.01)

(58) Field of Classification Search

USPC ........................................................... 702/63

See application file for complete search history.

(56) References Cited

U.S. PATENT DOCUMENTS

| | | | | |
|---|---|---|---|---|
| 8,198,863 B1 * | 6/2012 | Wortham | ............ | H01M 10/488 320/132 |
| 9,869,723 B2 | 1/2018 | Wu | | |
| 2003/0197512 A1 * | 10/2003 | Miller | ................ | G01R 31/3648 324/426 |
| 2005/0038614 A1 * | 2/2005 | Botts | ................... | H01M 10/486 702/63 |
| 2009/0208818 A1 * | 8/2009 | Poff | .................... | H01M 50/569 429/50 |

(Continued)

FOREIGN PATENT DOCUMENTS

| | | |
|---|---|---|
| CN | 104184183 A | 12/2014 |
| CN | 107856559 A | 3/2018 |

(Continued)

*Primary Examiner* — Paul D Lee

(74) *Attorney, Agent, or Firm* — Winston Hsu

(57) ABSTRACT

The present invention provides a multi-battery system including a plurality of devices and a processing circuit. Each of the plurality of devices includes a battery, a measurement circuit and a communication interface, wherein the measurement circuit is configured to measure the battery to generate battery information, and the communication interface is configured to transmit the battery information. The processing circuit is configured to receive the plurality of battery information of the plurality of devices, and use a universal gauge master algorithm to process the battery information of the plurality of devices to generate a plurality of gauge results, respectively.

15 Claims, 3 Drawing Sheets

(56) References Cited

U.S. PATENT DOCUMENTS

| | | | | |
|---|---|---|---|---|
| 2012/0049802 | A1* | 3/2012 | Barsukov | G01R 31/367<br>320/136 |
| 2014/0244193 | A1 | 8/2014 | Balasingam | |
| 2015/0331056 | A1* | 11/2015 | Zhang | G01R 31/3842<br>702/63 |
| 2016/0320456 | A1* | 11/2016 | Hawawini | G01R 31/3842 |
| 2017/0108906 | A1* | 4/2017 | Chandra | G01R 31/382 |
| 2018/0335478 | A1* | 11/2018 | Kondo | G01R 31/392 |
| 2020/0284841 | A1* | 9/2020 | Moon | G01R 31/364 |
| 2021/0173012 | A1 | 6/2021 | Subbotin | |
| 2022/0037892 | A1 | 2/2022 | Beyer | |
| 2022/0069376 | A1 | 3/2022 | Baughman | |
| 2023/0029810 | A1 | 2/2023 | Konishi | |

FOREIGN PATENT DOCUMENTS

| | | | |
|---|---|---|---|
| CN | 210894630 | U | 6/2020 |
| DE | 10 2020 131 806 | A1 | 6/2021 |
| JP | 2018-57120 | A | 4/2018 |
| TW | 201702623 | A | 1/2017 |
| WO | 2018/147897 | A1 | 8/2018 |
| WO | 2020/116312 | A1 | 6/2020 |
| WO | 2020/260623 | A1 | 12/2020 |

* cited by examiner

UNIVERSAL GAUGE MASTER SOLUTION AT MULTI-BATTERY SYSTEM

CROSS REFERENCE TO RELATED APPLICATIONS

This application claims the benefit of U.S. Provisional Application No. 63/317,094, filed on Mar. 7, 2022. The content of the application is incorporated herein by reference.

BACKGROUND

At present, multi-battery systems have been widely used in electronic devices and peripheral components. For example, foldable mobile phone may have two or more batteries to power different areas, a power bank may have many batteries for providing power to external device(s), and a mobile phone may communicate with surrounding earphones, watches or other measuring components in a wired or wireless way. Generally, each battery has its own fuel gauge for providing battery information such as charging state or remaining capacity, however, putting the fuel gauge in every battery will significantly increase manufacturing costs, and functionality and quality of each fuel gauge may be inconsistent.

SUMMARY

It is therefore an objective of the present invention to provide an universal gauge master method of a multi-battery system to solve the above-mentioned problems According to one embodiment of the present invention, a multi-battery system comprising a plurality of devices and a processing circuit is disclosed. Each of the plurality of devices comprises a battery, a measurement circuit and a communication interface, wherein the measurement circuit is configured to measure the battery to generate battery information, and the communication interface is configured to transmit the battery information. The processing circuit is configured to receive the plurality of battery information of the plurality of devices, and use a universal gauge master algorithm to process the battery information of the plurality of devices to generate a plurality of gauge results, respectively.

According to one embodiment of the present invention, a processing circuit within an electronic device is configured to perform the steps of: receiving a first battery information from a first device, wherein the first battery information corresponds to a first battery within the first device; using a universal gauge master algorithm to process the first battery information to generate a first gauge result; receiving a second battery information from a second device, wherein the second battery information corresponds to a second battery within the second device; and using the universal gauge master algorithm to process the second battery information to generate a second gauge result.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
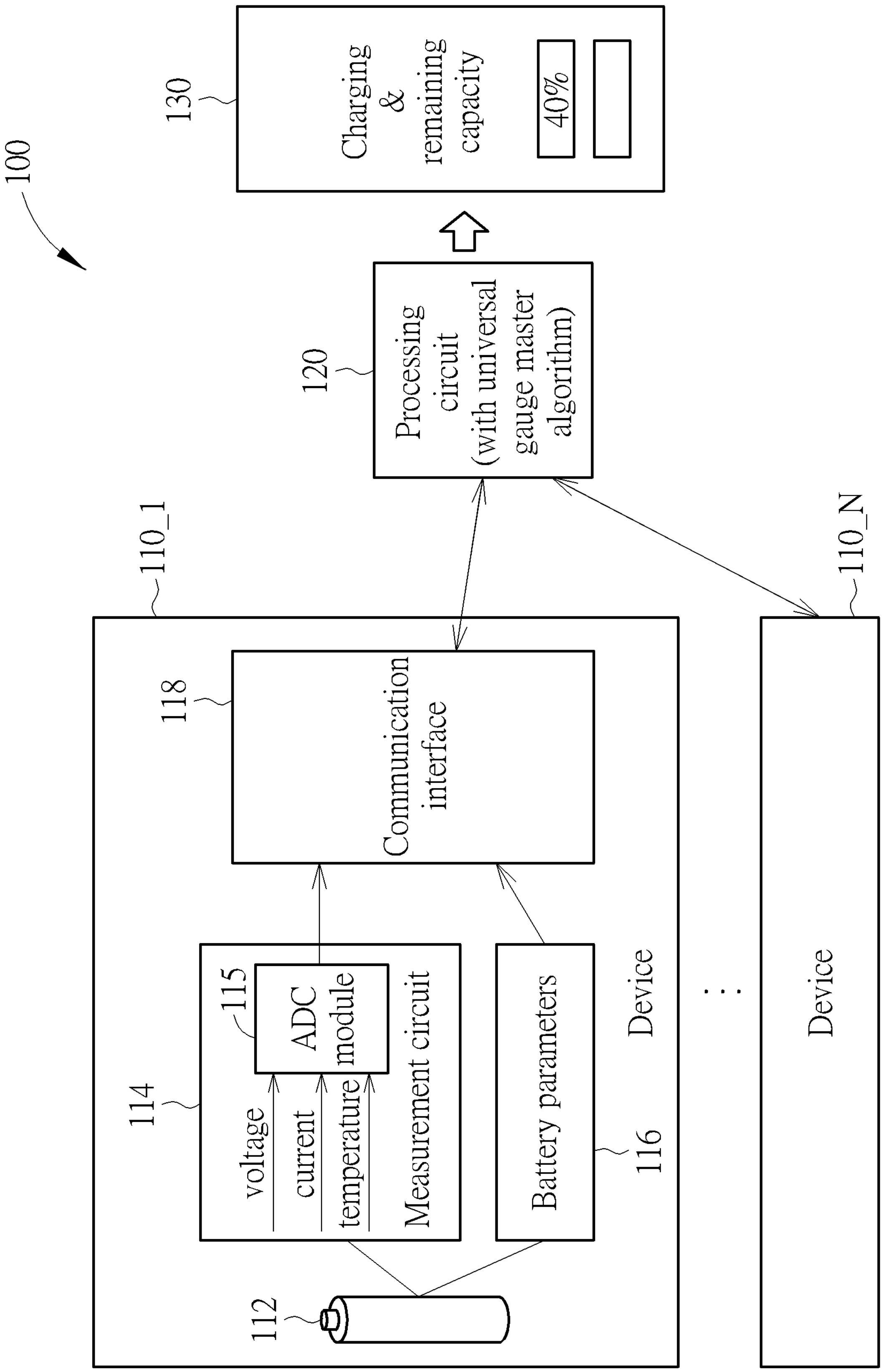
FIG. 1 is a diagram illustrating a multi-battery system according to a first embodiment of the present invention.

FIG. 1 is a diagram illustrating a multi-battery system 100 according to one embodiment of the present invention. As shown in FIG. 1, the multi-battery system 100 comprises a plurality of devices 110_1-110_N, a processing circuit 120 and a multi-media interface 130, wherein N can be any suitable positive integer greater than one. In this embodiment, each of the devices 110_1-110_N comprises a battery 112, a measurement circuit 114 comprising an analog-to-digital converter (ADC) module 115, battery parameters 116 and a communication interface 118.

In the embodiment shown in FIG. 1, each of the devices 110_1-110_N can be a battery pack or an electronic device comprising a battery. For example, one or more of the devices 110_1-110_N may be a battery pack included in a mobile phone or a tablet including the processing circuit 120. In addition, one or more of the devices 110_1-110_N may be an earphone, a watch or any other electronic device that can communicate with a mobile phone or a tablet including the processing circuit 120, wherein the communication interface 118 may be a Wi-Fi interface circuit or a Bluetooth interface circuit. In one embodiment, two of the devices 110_1-110_N are included in a mobile phone including the processing circuit 120, that is the two devices are two battery packs. In another embodiment, the device 110_1 is included in a mobile phone including the processing circuit 120, and the device 110_2 is an earphone or a watch that is wirelessly connected to the mobile phone.

In the operation of the device 110_1, the measurement circuit 114 is configured to measure a voltage, a current and a temperature of the battery 112, and the ADC module 115 performs an analog-to-digital conversion operation on the voltage, the current and the temperature of the battery 112 to generate corresponding digital codes, respectively. Specifically, the measurement circuit 114 can measure a voltage at an anode of the battery 112 to obtain the voltage of the battery; the measurement circuit 114 can measure a cross voltage of a sensing resistor, and calculate a current of the battery 112 according to the cross voltage and resistance of the sensing resistor; and the measurement circuit 114 can use a negative temperature coefficient thermistor to obtain the temperature of the battery 112. In addition, the ADC module 115 may comprise one or more ADCs for performing the analog-to-digital conversion operation, for example, the ADC module 115 may comprise only one ADC that performs the analog-to-digital conversion operation on the voltage, current and temperature of the battery 112 in a time-division multiplexing manner; or the ADC module 115 may comprise three ADCs for performs the analog-to-digital conversion operation on the voltage, current and temperature of the battery 112, respectively. It is noted that operations of the measurement circuit 114 are for illustratively only, not a limitation of the present invention.

In this embodiment, the device 110_1 does not have any battery fuel gauge, and the digital codes of the voltage, current and temperature of the battery 112 are transmitted to the processing circuit 120 via the communication interface 118.

In addition, the battery parameters 116 stored in the device 110_1 may comprise open circuit voltage (OCV), a maximal chemical capacity (Qmax), a battery resistance and/or any other parameters, and the battery parameters 116 are transmitted to the processing circuit 120 via the communication interface 118 when the device 110_1 is initially connected to the processing circuit 120.

Similarly, the other device(s) such as 110_N also transmits its digital codes of the voltage, the current and the temperature of the battery to the processing circuit 120.

The processing circuit 120 may be an application processor capable of executing an universal gauge master algorithm, or the processing circuit 120 may be a power management integrated circuit (PMIC) having circuits capable of performing the universal gauge master algorithm. After receiving the battery parameters and battery information such as digital codes of voltage, current and temperature of the battery 112 of the device 110_1, the processing circuit 120 can establish a battery model of the battery 112 according to the battery parameters, and use the battery model and the battery information to determine a gauge result, wherein the gauge result may comprise charging state, remaining capacity, full charge capacity, state of health, lifetime, or any other information related to the battery 112. It is noted that the generation of the above gauge results is known by a person skilled in the art, further descriptions are omitted here.

In addition, the processing circuit 120 also uses the battery model and the battery information of the other device such as 110_N to determine the gauge result of the battery within the 110_N.

After determining the gauge results of the devices, respectively, the processing circuit 120 transmits the gauge results to the following elements via the multi-media interface 130. For example, if the processing circuit 120 is within a mobile phone, the gauge results can be displayed on a screen, so that a user can see the gauge results of different devices. In another example, if the device 110_1 is within a mobile phone including the processing circuit 120, and the device 110_2 is external to the mobile phone, the processing circuit 120 can show the gauge result of the device 110_1 on a screen of the mobile phone, and transmit the gauge result of the device 110_2 to the device 110_2.

In the above embodiment shown in FIG. 1, because the battery information of the devices 110_1-110_N is directly transmitted to the processing circuit 120 for generating corresponding gauge results, there is no need to setup a battery fuel gauge within the device, and manufacturing costs of the devices 110_1-110_N are decreased. In addition, because the universal gauge master algorithm of the processing circuit 120 has more functions and better accuracy, the gauge result will be more in line with a real state of the battery.

In one embodiment, not all of the gauge results of the devices 110_1-110_N are transmitted to the following element via the multi-media interface 130, and two or more battery information or gauge results of the devices 110_1-110_N can be analyzed to determine an output gauge result. Specifically, the processing circuit 120 can generate an output gauge result based on the battery information or gauge results of at least two of the devices 110_1-110_N and a state or characteristic of the multi-battery system 100. For example, assuming that the devices 110_1 and 110_2 are two battery packs within two parts of an foldable mobile phone, if the battery power of the device 110_2 declines so much that the foldable mobile phone should be powered off or enter a power saving mode, the processing circuit 120 may generate the output gauge result mainly based on the battery information or gauge result of the device 110_2, that is the output gauge result shows that the remaining charge of the foldable mobile phone is not enough via the multi-media interface 130, even if the batter information or the gauge result of the device 110_1 indicates that its battery has enough charge.

Figure 2:
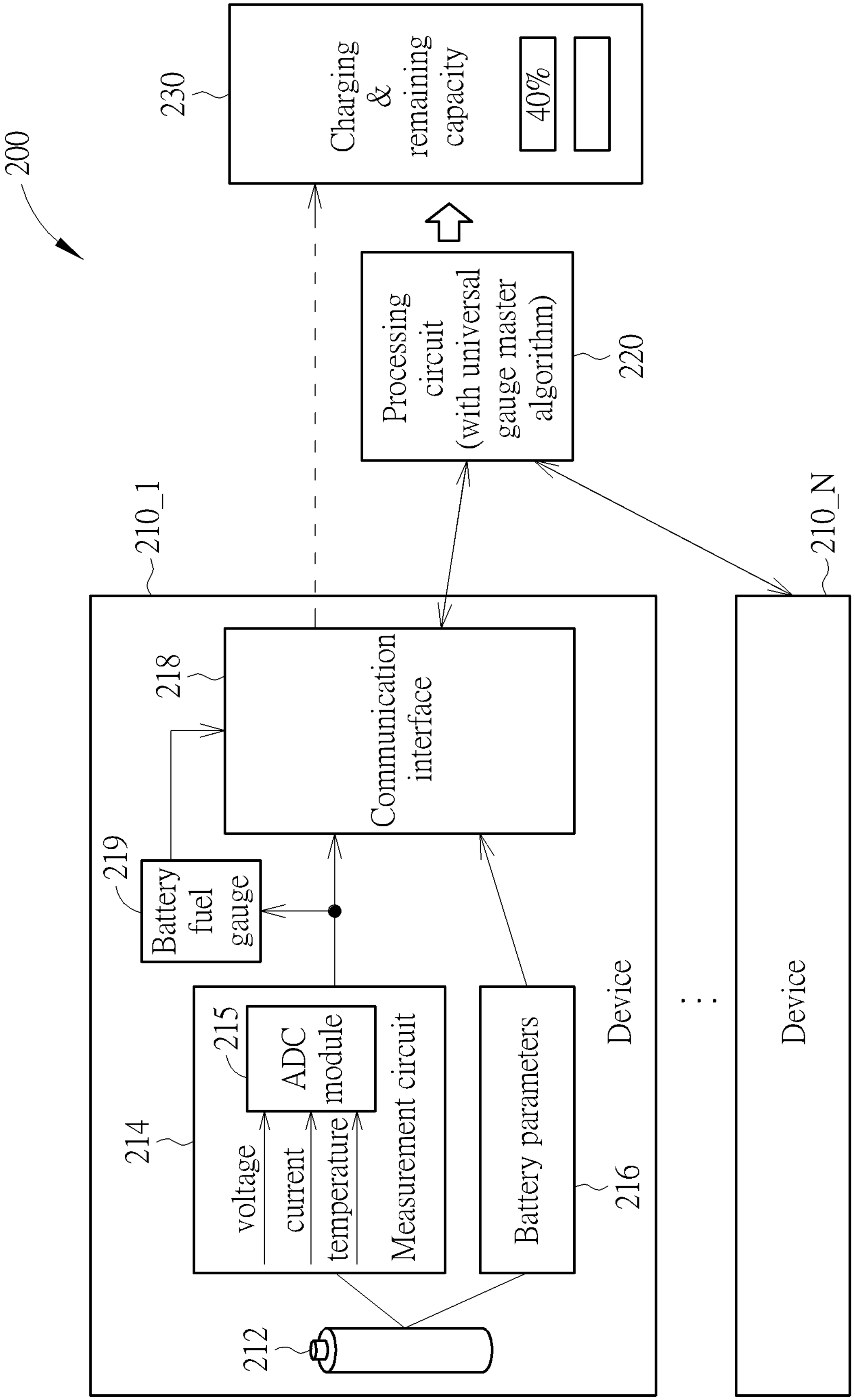
FIG. 2 is a diagram illustrating a multi-battery system according to a second embodiment of the present invention.

FIG. 2 is a diagram illustrating a multi-battery system 200 according to one embodiment of the present invention. As shown in FIG. 2, the multi-battery system 200 comprises a plurality of devices 210_1-210_N, a processing circuit 220 and a multi-media interface 230, wherein N can be any suitable positive integer greater than one. In this embodiment, each of the devices 210_1-210_N comprises a battery 212, a measurement circuit 214 comprising an ADC module 215, battery parameters 216, a communication interface 218 and a battery fuel gauge 219.

In the embodiment shown in FIG. 2, each of the devices 210_1-210_N can be a battery pack or an electronic device comprising a battery. For example, one or more of the devices 210_1-210_N may be a battery pack included in a mobile phone or a tablet including the processing circuit 220. In addition, one or more of the devices 210_1-210_N may be an earphone, a watch or any other electronic device that can communicate with a mobile phone or a tablet including the processing circuit 220. In one embodiment, two of the devices 210_1-210_N are included in a mobile phone including the processing circuit 220, that is the two devices are two battery packs. In another embodiment, the device 210_1 is included in a mobile phone including the processing circuit 220, and the device 210_2 is an earphone or a watch that is wirelessly connected to the mobile phone.

In the operation of the device 210_1, the measurement circuit 214 is configured to measure a voltage, a current and a temperature of the battery 212, and the ADC module 215 performs an analog-to-digital conversion operation on the voltage, current and temperature of the battery 212 to generate corresponding digital codes, respectively.

The battery fuel gauge 219 is a simple fuel gauge with less functions and accuracy, and the battery fuel gauge 219 receives the battery information such as digital codes of voltage, current and temperature of the battery 212 to generate a simple gauge result, wherein the simple gauge result may comprise charging state and remaining capacity. In addition, the battery fuel gauge 219 may transmit the simple gauge result to the following element such as multi-media interface 230 via the communication interface 218, or the battery fuel gauge 219 may transmit the simple gauge result to the processing circuit 220 via the communication interface 218.

In addition, the battery parameters 216 stored in the device 210_1 may comprise OCV, Qmax, battery resistance and/or any other parameters, and the battery parameters 216 are transmitted to the processing circuit 220 via the communication interface 218 when the device 210_1 is initially connected to the processing circuit 220.

Similarly, the other device(s) such as 210_N also transmits its digital codes of the voltage, current and temperature of the battery to the processing circuit 220.

The processing circuit 220 may be an application processor capable of executing an universal gauge master algorithm, or the processing circuit 220 may be a PMIC having circuits capable of performing the universal gauge master algorithm. After receiving the battery parameters and battery information such as digital codes of voltage, current and temperature of the battery 212 of the device 210_1, the processing circuit 220 can establish a battery model of the battery 212 according to the battery parameters, and use the battery model and the battery information to determine a gauge result, wherein the gauge result may comprise charging state, remaining capacity, full charge capacity, state of health, lifetime, or any other information related to the battery 212.

In addition, the generation of the gauge result may also refer to the simple gauge result generated by the battery fuel gauge 219.

In addition, the processing circuit 220 also uses the battery model and the battery information of the other device such as 210_N to determine the gauge result of the 210_N.

After determining the gauge results of the devices, respectively, the processing circuit 220 transmits the gauge results to the following elements via the multi-media interface 230. For example, if the processing circuit 220 is within a mobile phone, the gauge results can be displayed on a screen, so that a user can see the gauge results of different devices. In another example, if the device 210_1 is within a mobile phone including the processing circuit 220, and the device 210_2 is external to the mobile phone, the processing circuit 220 can show the gauge result of the device 210_1 on a screen of the mobile phone, and transmit the gauge result of the device 210_2 to the device 210_2.

In one embodiment, the battery fuel gauge 219 can be enabled or not according the connection between the device 210_1 and the processing circuit 220. Specifically, if the processing circuit 220 is not connected to the device 210_1, the battery fuel gauge 219 can be enabled to generate the simple gauge result; and if the processing circuit 220 is connected to the device 210_1, the battery fuel gauge 219 can be disabled, and only the gauge result generated by the processing circuit 220 is transmitted to the multi-media interface 230.

In the above embodiment shown in FIG. 2, because the battery information of the devices 210_1-210_N is directly transmitted to the processing circuit 220 for generating corresponding gauge results, and the device only has a simple battery fuel gauge, the manufacturing costs of the devices 210_1-210_N are decreased. In addition, because the universal gauge master algorithm of the processing circuit 220 has more functions and better accuracy, the gauge result will be more in line with a real state of the battery.

In an alternative embodiment, multi-battery system 100 and the multi-battery system 200 can be combined so that part of the device(s) does not have any battery fuel gauge, and another part of the device(s) has a simple battery fuel gauge.

Figure 3:
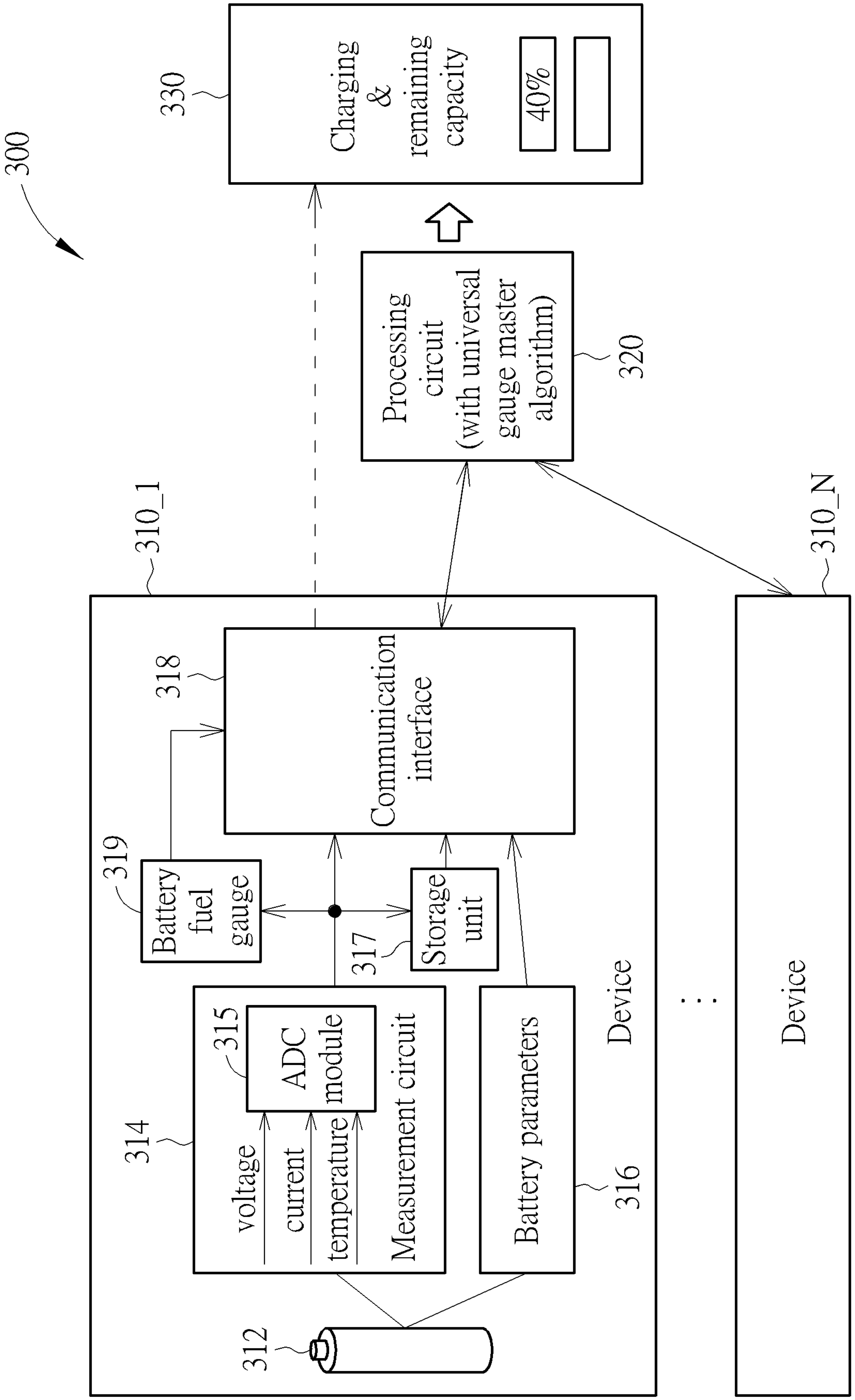
FIG. 3 is a diagram illustrating a multi-battery system according to a third embodiment of the present invention.

FIG. 3 is a diagram illustrating a multi-battery system 300 according to one embodiment of the present invention. As shown in FIG. 3, the multi-battery system 300 comprises a plurality of devices 310_1-310_N, a processing circuit 320 and a multi-media interface 330, wherein N can be any suitable positive integer greater than one. In this embodiment, each of the devices 310_1-310_N comprises a battery 312, a measurement circuit 314 comprising an ADC module 315, battery parameters 316, a storage unit 317, a communication interface 318 and a battery fuel gauge 319.

In the embodiment shown in FIG. 3, each of the devices 310_1-310_N can be a battery pack or an electronic device comprising a battery. For example, one or more of the devices 310_1-310_N may be a battery pack included in a mobile phone or a tablet including the processing circuit 320. In addition, one or more of the devices 310_1-310_N may be an earphone, a watch or any other electronic device that can communicate with a mobile phone or a tablet including the processing circuit 320. In one embodiment, two of the devices 310_1-310_N are included in a mobile phone including the processing circuit 320, that is the two devices are two battery packs. In another embodiment, the device 310_1 is included in a mobile phone including the processing circuit 320, and the device 310_2 is an earphone or a watch that is wirelessly connected to the mobile phone.

In the operation of the device 310_1, the measurement circuit 314 is configured to measure a voltage, a current and a temperature of the battery 312, and the ADC module 315 performs an analog-to-digital conversion operation on the voltage, current and temperature of the battery 312 to generate corresponding digital codes, respectively.

The battery fuel gauge 319 is a simple fuel gauge with less functions and accuracy, and the battery fuel gauge 319 receives the battery information such as digital codes of voltage, current and temperature of the battery 312 to generate a simple gauge result, wherein the simple gauge result may comprise charging state and remaining capacity. In addition, the battery fuel gauge 319 may transmit the simple gauge result to the following element such as multi-media interface 330 via the communication interface 318, or the battery fuel gauge 319 may transmit the simple gauge result to the processing circuit 320 via the communication interface 318.

In addition, the storage unit 317 stores a battery information history, wherein the battery information history comprises digital codes of voltage, current and temperature of the battery 312 over the past period of time (e.g., several hours or several days).

In addition, the battery parameters 316 stored in the device 310_1 may comprise OCV, Qmax, battery resistance and/or any other parameters, and the battery parameters 316 are transmitted to the processing circuit 320 via the communication interface 318 when the device 310_1 is initially connected to the processing circuit 320.

Similarly, the other device(s) such as 310_N also transmits its digital codes of the voltage, the current and the temperature of the battery to the processing circuit 320.

The processing circuit 320 may be an application processor capable of executing an universal gauge master algorithm, or the processing circuit 320 may be a PMIC having circuits capable of performing the universal gauge master algorithm. After receiving the battery parameters and battery information such as digital codes of voltage, current and temperature of the battery 312 of the device 310_1, the processing circuit 320 can establish a battery model of the battery 312 according to the battery parameters, and use the battery model and the battery information to determine a gauge result, wherein the gauge result may comprise charging state, remaining capacity, full charge capacity, state of charge, state of health, lifetime, remaining capacity history, or any other information related to the battery 312.

In addition, the processing circuit 320 also uses the battery model and the battery information of the other device such as 310_N to determine the gauge result of the 310_N.

After determining the gauge results of the devices, respectively, the processing circuit 320 transmits the gauge results to the following elements via the multi-media interface 330. For example, if the processing circuit 320 is within a mobile phone, the gauge results can be displayed on a screen, so that a user can see the gauge results of different devices. In another example, if the device 310_1 is within a mobile phone including the processing circuit 320, and the device 310_2 is external to the mobile phone, the processing circuit 320 can show the gauge result of the device 310_1 on a screen of the mobile phone, and transmit the gauge result of the device 310_2 to the device 310_2.

In the above embodiment shown in FIG. 3, because the battery information of the devices 310_1-310_N is directly transmitted to the processing circuit 320 for generating corresponding gauge results, and the device only has a simple battery fuel gauge, the manufacturing costs of the devices 310_1-310_N are decreased. In addition, because the universal gauge master algorithm of the processing circuit 320 has more functions and better accuracy, the gauge result will be more in line with a real state of the battery.

In an alternative embodiment, the multi-battery system 100, the multi-battery system 200, and/or multi-battery system 300 can be combined so that part of the device(s) does not have any battery fuel gauge, part of the device(s) has a simple battery fuel gauge, and part of the device(s) has a storage unit for storing battery information history.

Those skilled in the art will readily observe that numerous modifications and alterations of the device and method may be made while retaining the teachings of the invention. Accordingly, the above disclosure should be construed as limited only by the metes and bounds of the appended claim

What is claimed is:

1. A multi-battery system, comprising:

a plurality of devices, wherein each of the plurality of devices comprises:

a battery;

a dedicated measurement circuit disposed within the respective device and comprising an analog-to-digital converter (ADC), configured to measure the battery, and perform an analog-to-digital conversion operation on measured results of the battery to generate digital codes serving as battery information;

a communication interface, coupled to the measurement circuit, configured to transmit the battery information;

a processing circuit, configured to receive the plurality of battery information transmitted from the plurality of devices, and process the battery information of the plurality of devices to generate a plurality of gauge results corresponding to the plurality of devices, respectively;

wherein the processing circuit is further configured to generate an output gauge result according to at least one of the plurality of gauge results, and the output gauge result triggers the multi-battery system to enter a power saving mode or a power-off state when indicating an insufficient remaining charge.

2. The multi-battery system of claim 1, wherein the battery information comprises the digital codes of a voltage, a current and a temperature of the battery.

3. The multi-battery system of claim 1, wherein each of the plurality of devices comprises battery parameters, each of the plurality of devices transmits the battery parameters to the processing circuit via the communication interface, the processing circuit establishes a battery model of the battery according to the battery parameters, and the processing circuit uses the battery model and the battery information to determine the gauge result.

4. The multi-battery system of claim 1, wherein the plurality of devices comprise a first device and a second device, and the first device and the second device and the processing circuit are within one electronic device.

5. The multi-battery system of claim 1, wherein the plurality of devices comprise a first device and a second device, the first device and the processing circuit are within an electronic device, and the second device is external to the electronic device and communicates wirelessly with the electronic device.

6. The multi-battery system of claim 1, wherein the plurality of devices further comprise a first device, and the first device further comprises:

a battery fuel gauge, configured to generate a simple gauge result according to the battery information;

wherein the battery fuel gauge transmits the simple gauge result to the processing circuit via the communication interface.

7. The multi-battery system of claim 1, wherein the plurality of devices further comprise a first device, and the first device further comprises:

a storage unit, configured to store battery information history, wherein the battery information history comprises the digital codes of voltage, current and temperature of the battery over a past period of time;

wherein the battery information history is transmitted to the processing circuit via the communication interface.

8. The multi-battery system of claim 1, wherein the plurality of gauge results respectively correspond to the batteries of the plurality of devices, and each of the gauge results comprises at least one of charging state, remaining capacity, full charge capacity, state of health and lifetime of the corresponding battery.

9. The multi-battery system of claim 1, wherein the processing circuit generates an output gauge result according to a first gauge result and a second gauge result of the plurality of gauge results and a state or characteristic of the multi-battery system.

10. A processing circuit within an electronic device, configured to perform the steps of:

receiving a first battery information from a first device, wherein the first battery information corresponds to a first battery within the first device, and the first battery information is generated by using a dedicated measurement circuit within the first device to measure the first battery, and performing an analog-to-digital conversion operation on measured results of the first battery;

processing the first battery information to generate a first gauge result;

receiving a second battery information from a second device, wherein the second battery information corresponds to a second battery within the second device, and the second battery information is generated by using a dedicated measurement circuit within the second device to measure the second battery, and performing the analog-to-digital conversion operation on measured results of the second battery;

processing the second battery information to generate a second gauge result; and generating an output gauge result according to the first gauge result and the second gauge result, to trigger the electronic device to enter a power saving mode or a power-off state when indicating an insufficient remaining charge.

11. The processing circuit of claim 10, wherein the first device and the second device are within the electronic device.

12. The processing circuit of claim 10, wherein the first device is within the electronic device, and the second device is external to the electronic device.

13. The processing circuit of claim 10, further comprising:

receiving battery parameters of the first battery from the first device;

establishing a battery model of the first battery according to the battery parameters; and a step of using a universal gauge master algorithm to process the first battery information to generate the first gauge result comprises:

using the universal gauge master algorithm and the battery model to process the first battery information to generate the first gauge result.

14. The processing circuit of claim 10, wherein the first gauge result comprises at least one of charging state, remaining capacity, full charge capacity, state of charge, state of health and lifetime of the first battery; and the second gauge result comprises at least one of charging state, remaining capacity, full charge capacity, state of charge, state of health and lifetime of the second battery.

15. The processing circuit of claim 10, wherein the processing circuit is further configured to perform the steps of:

generating an output gauge result according to a first gauge result and a second gauge result of the plurality of gauge results and a state or characteristic of the electronic device.

* * * * *